United States Patent
Mueller et al.

(10) Patent No.: US 6,359,471 B1
(45) Date of Patent: Mar. 19, 2002

(54) MIXED SWING VOLTAGE REPEATERS FOR HIGH RESISTANCE OR HIGH CAPACITANCE SIGNAL LINES AND METHODS THEREFOR

(75) Inventors: Gerhard Mueller, Wappingers Falls; David R. Hanson, Brewster, both of NY (US)

(73) Assignees: Infineon Technologies North America Corp., Cupertino, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/491,645

(22) Filed: Jan. 27, 2000

Related U.S. Application Data

(63) Continuation-in-part of application No. 09/037,289, filed on Mar. 9, 1998, now Pat. No. 6,181,165.

(51) Int. Cl.[7] ............... H03K 19/0175; H03K 19/00; H03K 19/003
(52) U.S. Cl. ............... 326/81; 326/86; 326/30; 326/68; 326/57; 326/56
(58) Field of Search ............... 326/30, 31, 56–58, 326/83, 86, 68, 80, 81

(56) References Cited

U.S. PATENT DOCUMENTS

| | | | | |
|---|---|---|---|---|
| 5,179,299 A | * | 1/1993 | Tipon | 307/443 |
| 5,202,593 A | * | 4/1993 | Huang et al. | 307/475 |
| 5,255,287 A | | 10/1993 | Davies et al. | 375/17 |
| 5,559,996 A | * | 9/1996 | Fujioka | 395/500 |
| 5,801,549 A | * | 9/1998 | Cao et al. | 326/83 |
| 5,952,847 A | | 9/1999 | Plants et al. | 326/80 |
| 6,137,167 A | * | 10/2000 | Ahn et al. | 257/691 |

* cited by examiner

*Primary Examiner*—Michael Tokar
*Assistant Examiner*—Vibol Tan
(74) *Attorney, Agent, or Firm*—Slater & Matsil LLP

(57) ABSTRACT

A mixed swing voltage repeater circuit operates with reduced voltage signals, that is signals having a voltage level that is below a full swing voltage level. The mixed swing voltage repeater circuit is configured to be coupled to the signal line and has an input node coupled to a first portion of the signal line for receiving a reduced voltage signal and an output node coupled to a second portion of the signal line for outputting a full swing voltage signal. In another embodiment, the mixed swing voltage repeater circuit is configured to be coupled to the signal line and has an input node coupled to a first portion of the signal line for receiving a full swing voltage signal and an output node coupled to a second portion of the signal line for outputting a reduced swing voltage signal.

63 Claims, 12 Drawing Sheets

MIXED SWING VOLTAGE REPEATERS FOR HIGH RESISTANCE OR HIGH CAPACITANCE SIGNAL LINES AND METHODS THEREFOR

This application is a continuation in part of U.S. patent application Ser. No. 09/037,289 entitled "Reduced voltage input/reduced voltage output tri-state buffers and methods therefor," now U.S. Pat. No. 6,181,165 filed Mar. 9, 1998, which is incorporated herein by reference.

RELATED APPLICATIONS

This application is related to the following applications, which are filed on the same date herewith and incorporated herein by reference:

Application entitled "REDUCED VOLTAGE INPUT/ REDUCED VOLTAGE OUTPUT REPEATERS FOR HIGH RESISTANCE OR HIGH CAPACITANCE SIGNAL LINES AND METHODS THEREFOR" filed by inventors Gerhard Mueller and David R. Hanson on the same date.

Application entitled "FULL SWING VOLTAGE INPUT/ FULL SWING VOLTAGE OUTPUT BI-DIRECTIONAL REPEATERS FOR HIGH RESISTANCE OR HIGH CAPACITANCE BI-DIRECTIONAL SIGNAL LINES AND METHODS THEREFOR" filed by inventors Gerhard Mueller and David R. Hanson on the same date.

BACKGROUND OF THE INVENTION

The present invention relates to repeater circuits for high resistance and/or high capacitance signal lines on an integrated circuit. More particularly, the present invention relates to mixed swing voltage repeaters which, when employed on a high resistance and/or high capacitance signal line, reduce the signal propagation delay, power dissipation, chip area, electrical noise, and/or electromigration.

In some integrated circuits, there exist signal lines that span long distances and/or are coupled to many circuits. In modern dynamic random access memory circuits, for example, certain unidirectional signal lines such as address lines may be coupled to many circuits and may therefore have a high capacitive load and/or resistance associated therewith. Likewise, certain bi-directional lines such as read write data (RWD) lines may also be coupled to many circuits and may therefore also have a high capacitive load and/or resistance associated therewith. The problem of high capacitive load and/or resistance also arises for many signal lines in modern microprocessors, digital signal processors, or the like. By way of example, the same issue may be seen with loaded read data lines and write data lines of memory circuits, clock lines of an integrated circuit, command lines, and/or any loaded signal carrying conductor of an integrated circuit. The propagation delay times for these signal lines, if left unremedied, may be unduly high for optimal circuit performance.

To facilitate discussion, FIG. 1 illustrates an exemplary signal line 100, representing a signal conductor that may be found in a typical integrated circuit. Signal line 100 includes resistors 102 and 104, representing the distributed resistance associated with signal line 100. Resistors 102 and 104 have values that vary with, among others, the length of signal line 100. There are also shown capacitors 106 and 108, representing the distributed capacitance loads associated with the wire or signal bus and the circuits coupled to signal line 100.

The resistance and capacitance associated with signal line 100 contribute significantly to a signal propagation delay between an input 110 and an output 112. As discussed in a reference entitled "Principles of CMOS VLSI design: A Systems Perspective" by Neil Weste and Kamran Eshraghian, 2nd ed. (1992), the propagation delay of a typical signal line may be approximately represented by the equation $$t_{delay} = 0.7(RC)(n)(n+1)/2 \quad \text{Eq. 1}$$

wherein n equals the number of sections, R equals the resistance value, C equals the capacitance value. For the signal line of FIG. 1, the propagation delay is therefore approximately 2.1 RC (for n=2).

If the resistance value (R) and/or the capacitance value (C) is high, the propagation delay with signal line 100 may be significantly large and may unduly affect the performance of the integrated circuit on which signal line 100 is implemented. For this reason, repeaters are often employed in such signal lines to reduce the propagation delay.

FIG. 2 depicts a signal line 200, representing a signal line having thereon a repeater to reduce its propagation delay. Signal line 200 is essentially signal line 100 of FIG. 1 with the addition of a repeater 202 disposed between an input 210 and an output 212. In the example of FIG. 2V, repeater 202 is implemented by a pair of cascaded CMOS inverter gates 204 and 206 as shown. For ease of discussion, repeater 202 is disposed such that it essentially halves the distributed resistance and capacitance of signal line 200.

In this case, the application of Eq. 1 yields a propagation delay of 0.7 (RC)+$t_{DPS}$+$t_{DPS}$+0.7 (RC) or 1.4 (RC)+2$t_{DPS}$, wherein $t_{DPS}$ represents the time delay per inverter stage. Since $t_{DPS}$ may be made very small (e.g., typically 250 ps or less in most cases), the use of repeater 202 substantially reduces the propagation delay of the signal line, particularly when the delay associated with the value of R and/or C is relatively large compared to the value of $t_{DPS}$.

Although the use of CMOS repeater 202 proves to be useful in reducing the propagation delay for some signal lines, such an CMOS inverter-based repeater approach fails to provide adequate performance in reduced voltage input and/or reduced voltage output applications. Reduced voltage input refers to input voltages that are lower than the full $V_{DD}$ or $V_{int}$, the internal voltage at which the chip operates. By way of example, if $V_{DD}$ is equal to 2, reduced voltage signal may swing from 0–1 V or –0.5 V to +0.5 V. In some cases, the reduced voltage may be low enough (e.g., 1 V) that it approaches the threshold voltage of the transistors (typically at 0.7 V or so). Likewise, reduced voltage output refers to output voltages that are lower than the full $V_{DD}$, the internal voltage at which the chip operates.

To appreciate the problems encountered when reduced voltage signals are employed in the inverter-based repeater, which is operated at $V_{DD}$ or $V_{int}$, consider the situation wherein the input of the inverter is logically high but is represented by a reduced voltage signal (e.g., around 1 V). In this case, not only does the n-FET of the CMOS inverter stage conduct as expected but the p-FET, which is in series thereto, may also be softly on, causing leakage current to traverse the p-FET. The presence of the leakage current significantly degrades the signal on the output of the repeater circuit (and/or greatly increasing power consumption).

Despite the fact that CMOS inverter-based repeaters do not provide a satisfactory solution in reduced voltage applications, chip designers continue to search for ways to implement repeaters in the reduced voltage integrated circuits. Reduced voltage signals are attractive to designers since reduced voltage signals tend to dramatically reduce the power consumption of the integrated circuit. Further, the use of reduced voltage signals leads to decreased electromigration in the conductors (e.g., aluminum conductors) of the integrated circuit. With reduced electromigration, the chance of developing voids or shorts in the conductors is concomitantly reduced. Further, the reduction in the power consumption also leads to decreased electrical noise since less charge is dumped on the ground and power buses of the integrated circuit at any given time.

As described in the aforementioned co-pending U.S. Application entitled "Reduced Voltage Input/Reduced Voltage Output Repeaters for High Resistance or High Capacitance Lines and Methods Therefor,", reduced voltage input/reduced voltage output repeaters may be employed in both unidirectional and bi-directional signal lines. However, it would additionally be desirable to provide repeaters that are capable of connection between a first node with reduced voltages and a second node with full swing voltages (i.e., mixed swing repeaters that can function as reduced voltage input/full voltage output and/or full voltage input/reduced voltage output repeaters).

In the unidirectional case, for example, wherein a first node operates at reduced voltages and a second node operates at full swing voltages, it would be desirable to implement a mixed swing voltages repeater that can propagate signals from the first node to second node.

Furthermore, it would be also be desirable in certain applications with bi-directional lines to utilize a mixed swing voltage bi-directional repeater that can operate between two nodes with different voltage range values in both directions (i.e., in the example above, in one direction, accepting reduced voltages at the first node as input and outputting the corresponding full voltages at the second node, and in the opposite direction, accepting full swing voltage as input at the second node and outputting the corresponding reduced voltage at the first node).

SUMMARY OF THE INVENTION

The invention relates, in one embodiment, to a method in an integrated circuit for implementing a mixed swing voltage repeater circuit on a signal line having thereon reduced voltage signals. The reduced voltage signals has a voltage level that is below a full swing voltage level. The full swing voltage level represents an internal voltage level at which the integrated circuit operates. The mixed swing voltage repeater circuit is configured to be coupled to the signal line and has an input node coupled to a first portion of the signal line for receiving a first reduced voltage signal and an output node coupled to a second portion of the signal line for outputting a full swing voltage signal.

The method includes coupling the input node to the first portion of the signal line, the input node being coupled to an input stage of the mixed swing voltage repeater circuit, the input stage being configured to receive the first reduced voltage signal on the signal line. The input stage is also coupled to a level shifter stage that is arranged to output at least one level shifter stage control signal responsive to the first reduced voltage signal, a voltage level of the at least one level shifter stage control signal being higher than a voltage level associated with the first reduced voltage signal. The method also includes coupling the output node to the second portion of the signal line. The output node also is coupled to an output stage of the mixed swing voltage repeater circuit. The output stage is configured to output the full swing voltage signal on the output node responsive to the at least one level shifter stage control signal.

In another embodiment, the invention elates to a mixed swing voltage repeater circuit implemented in an integrated circuit. The mixed swing voltage repeater circuit is configured to be coupled to a signal line and has an input node coupled to a first portion of the signal line for receiving a first reduced voltage signal and an output node coupled to a second portion of the signal line for outputting a full swing voltage signal. The first reduced voltage signal has a voltage level that is below a full swing voltage level. The full swing voltage level represents an internal voltage level at which the integrated circuit operates. The mixed swing voltage repeater circuit includes an input stage having the input node, the input node being coupled to the first portion of the signal line, the input stage being configured to receive the first reduced voltage signal on the signal line. The mixed swing voltage repeater circuit also includes a level shifter stage coupled to the input stage. The level shifter stage being arranged to output at least one level shifter stage control signal responsive to the first reduced voltage signal, a voltage level of the at least one level shifter stage control signal being higher than a voltage level associated with the first reduced voltage signal. The mixed swing voltage repeater circuit additionally includes an output stage having the output node, the output node being coupled to the second portion of the signal line. The output stage is configured to output the full swing voltage signal on the output node responsive to the at least one level shifter stage control signal.

In yet another embodiment, the invention elates to a method in an integrated circuit for implementing a mixed swing voltage repeater circuit on a signal line having thereon full swing voltage signals. The full swing voltage signals has a full swing voltage level representing an internal voltage level at which the integrated circuit operates and for outputting reduced voltage signals. The reduced voltage signals has a voltage level that is below the full swing voltage level. The mixed swing voltage repeater circuit is configured to be coupled to the signal line and has an input node coupled to a first portion of the signal line for receiving a first full swing voltage signal and an output node coupled to a second portion of the signal line for outputting a first reduced voltage signal voltage signal.

The method includes coupling the input node to the first portion of the signal line. The input node is coupled to a first stage of the mixed swing voltage repeater circuit. The first stage is configured to receive the first full swing voltage signal. The method also includes coupling the output node to the second portion of the signal line. The output node also is coupled to a second stage of the mixed swing voltage repeater circuit. The second stage is configured to output the first reduced voltage signal on the output node responsive to the first full swing voltage signal, wherein the second stage includes at least one of a level shifter stage and an output stage.

In yet another embodiment, the invention elates to a mixed swing voltage repeater circuit implemented in an integrated circuit. The mixed swing voltage repeater circuit is configured to be coupled to between a first portion of a signal line operating at a reduced voltage level and a second portion of the signal line operating at a full swing voltage level. The full swing voltage level represents an internal voltage level at which the integrated circuit operates. The mixed swing voltage repeater circuit is configured for receiving a first reduced voltage signal and outputs a first full swing voltage signal responsive to a first state of a repeater enable signal. The mixed swing voltage repeater circuit is configured for receiving the first full swing voltage signal and outputs the first reduced voltage signal responsive to a second state of the repeater enable signal.

The mixed swing voltage repeater circuit includes a first unidirectional repeater circuit coupled between the first portion of the signal line and the second portion of the signal line. The first unidirectional repeater circuit includes a first unidirectional repeater circuit input stage having the first input node, the first input node being coupled to the first portion of the signal line, the first unidirectional repeater circuit input stage is configured to receive the first reduced voltage signal on the first portion of the signal line responsive to the first state of the repeater enable signal.

The first unidirectional repeater circuit also includes a first unidirectional repeater circuit level shifter stage coupled to the first unidirectional repeater circuit input stage. The first unidirectional repeater circuit level shifter stage is arranged to output at least one level shifter stage control signal responsive to the first reduced voltage signal when the repeater enable signal is in the first state. A voltage level of the at least one level shifter stage control signal is higher than a voltage level associated with the first reduced voltage signal. The first unidirectional repeater circuit also includes a first unidirectional repeater circuit output stage having a first output node coupled to the second portion of the signal line. The first unidirectional repeater circuit output stage is configured to output the full swing voltage signal on the output node responsive to the at least one level shifter stage control signal when the repeater enable signal is in the first state.

The mixed swing voltage repeater circuit includes a second unidirectional repeater circuit coupled between the first portion of the signal line and the second portion of the signal line. The second unidirectional repeater circuit includes a first stage having a second input node coupled to the second portion of the signal line for receiving the first full swing voltage signal on the second portion of the signal line when the repeater enable signal has a second state. The second unidirectional repeater circuit also includes a second stage coupled to the first stage. The second stage has a second output node coupled to the first portion of the signal line. The second stage is configured to output the first reduced voltage signal on the output node responsive to the first full swing voltage when the repeater enable signal has a second state, wherein the second stage includes at least one of a level shifter stage and an output stage.

These and other features of the present invention will be described in more detail below in the detailed description of the invention and in conjunction with the following figures.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention It will be apparent, however, to one skilled in the art, that the present invention may be practiced without some or all of these specific details. In other instances, well known structures and/or process steps have not been described in detail in order to not unnecessarily obscure the present invention.

The invention relates, in one embodiment, to techniques for implementing mixed swing voltage repeaters in integrated circuits. In accordance with one aspect of the present invention, various mixed swing voltage tri-state buffer configurations are disclosed as being suitable candidates for bi-directional repeater applications. In the preferred embodiment, mixed swing voltage bi-directional repeaters are employed on high resistance and/or high capacitance bi-directional line(s) of an integrated circuit to reduce the signal propagation delay, power dissipation, chip area, electrical noise, and/or electromigration of the integrated circuit. On the other hand, various components of the disclosed bi-directional repeaters may readily be used in unidirectional application.

Similar to the bi-directional repeater case, mixed swing voltage unidirectional repeaters can also be employed on high resistance and/or high capacitance unidirectional line (s) of an integrated circuit to reduce the signal propagation delay, power dissipation, chip area, electrical noise, and/or electromigration.

Figure 1:
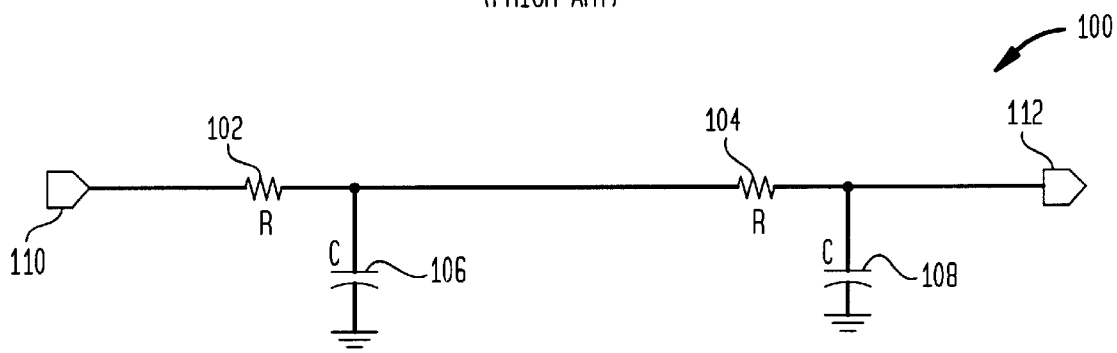
FIG. 1 illustrates an exemplary signal line, representing a signal conductor that may be found in a typical integrated circuit.
Figure 2:
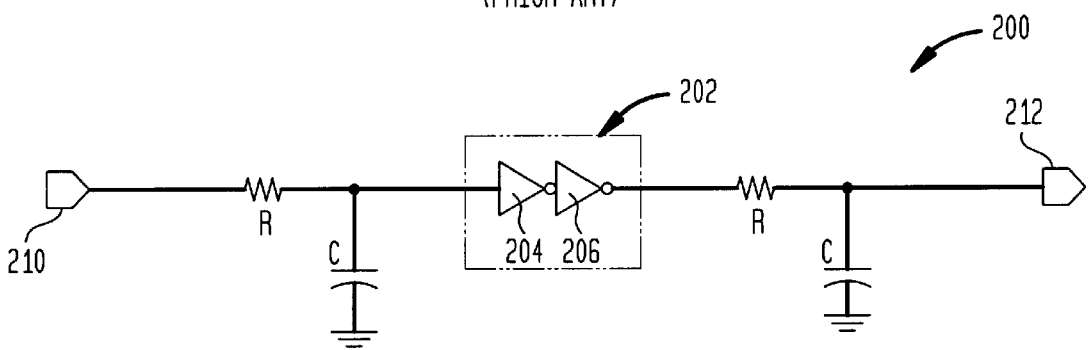
FIG. 2 depicts the signal line of FIG. 1 having thereon a repeater to reduce its propagation delay
Figure 3:
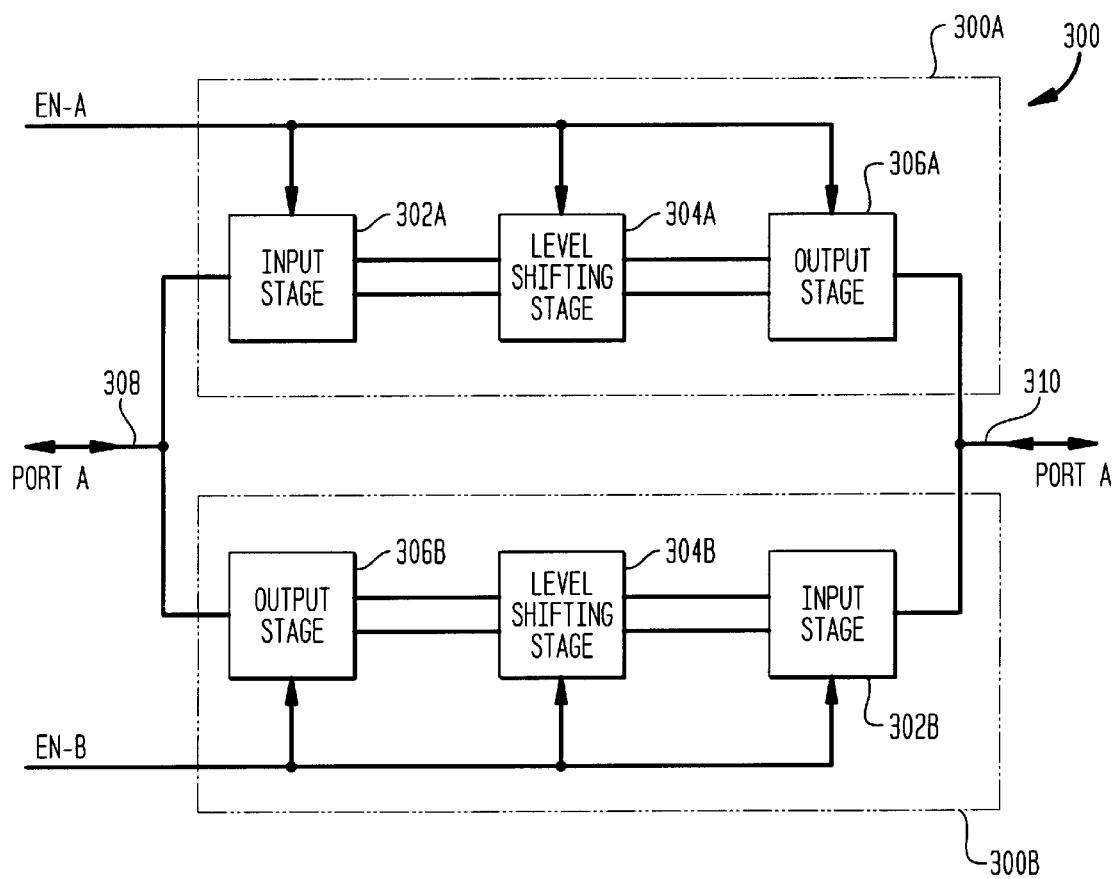
FIG. 3 illustrates, in accordance with one embodiment of the present invention, a simplified mixed swing voltage bi-directional tri-state buffer circuit, capable of functioning as mixed swing voltage bi-directional repeater circuit.

The features and advantages of the present invention may be better understood with reference to the figures that follow. FIG. 3 illustrates, in accordance with one embodiment of the present invention, a simplified bi-directional repeater circuit 300, including two tri-state buffers 300A (top portion) and 300B (bottom portion). As shown in FIG. 3, the output of tri-state buffer 300A is coupled to the input of tri-state buffer 300B, forming PORT A. Likewise, the output of tri-state buffer 300B is coupled to the input of tri-state buffer 300A, forming PORT B. Tri-state buffers 300A and 300B can be controlled by control signals EN_A and EN_B, which may be complementary signals or both equal to a logic level "0" (ground). Depending on the states of the control signals, PORT A may function as either an input port or an output port (with PORT B functioning as the respective output port or input port). These control signals, which can be coupled to the stages of the two tri-state buffers 300A and 300B, in accordance with techniques of the present invention, allow the bi-directional repeater circuit 300 to be implemented in various bi-directional applications such as RWD signal lines of DRAM ICs.

Each simplified tri-state buffer circuit (300A and 300B) includes an input stage 302, a level shifting stage 304, and optionally an output stage 306. Tri-state buffer circuit 300A represents a repeater circuit suitable for use in unidirectional reduced voltage input/full swing voltage output applications. In an analogous manner, the tri-state buffer circuit 300B represents a simplified repeater circuit suitable for use in a unidirectional full swing voltage input/reduced voltage output applications. The buffer enable signal EN_A can optionally be coupled to input stage 302A to control transistors therein, which pass the reduced voltage input signal on conductor 308 of PORT B to the level shifting stage 304A. As will be shown later herein, the buffer enable signal EN_A is also employed in some embodiments to control the passage of signals within level shifting stage 304A and/or the optional output stage 306A.

Within the level shifting stage 304A, transistors therein shift the received input signal to a higher voltage range (full swing voltages) to control gates of transistors within output stage 306A or to output them directly as full swing voltage signals that correspond to the input reduced voltage signals.

If an output stage 306A is employed, these control signals are passed on to output stage 306A, where the full swing voltages corresponding to reduced swing voltages received on PORT B can be outputted by output stage 306A on PORT A. The higher voltage control signals permit transistors within output stage 306A to be controlled with a higher overdrive voltage, thereby permitting transistors within output stage 306A to source/sink a greater amount of current, thus more rapidly drive the load coupled to the buffer output to the desired full swing voltage level.

In an analogous manner, the tri-state buffer circuit 300B represents a repeater circuit suitable for use in unidirectional full swing voltage input/reduced voltage output applications. The buffer enable signal EN_B can optionally be coupled to input stage 302B to control transistors therein, which pass the full swing voltage input signal on conductor 310 of PORT A to the level shifting stage 304B. The buffer enable signal EN_B may also be employed to control the passage of signals within level shifting stage 304B and/or the optional output stage 306B. Within level shifting stage 304B, transistors therein can generate control signals in the same full swing range and/or in a reduced voltage range to be output as reduced swing voltage signals corresponding to the input full swing voltage signals. If an output stage 306B is employed, these control signals are passed on to output stage 306B, where the reduced voltages corresponding to full swing voltages received on PORT A can be outputted by output stage 306B on PORT B.

In this manner, a mixed swing voltage bi-directional repeater can be employed between two nodes with different voltage ranges (i.e. reduced and full swing voltages) to facilitate propagation of signals between the nodes in both directions. It should be noted that each of the mixed swing voltage unidirectional repeaters (such as components 300A or 300B) that makes up a mixed swing voltage bi-directional repeater (such as circuit 300) may be used alone to facilitate propagation of signals in a single direction.

Figure 4:
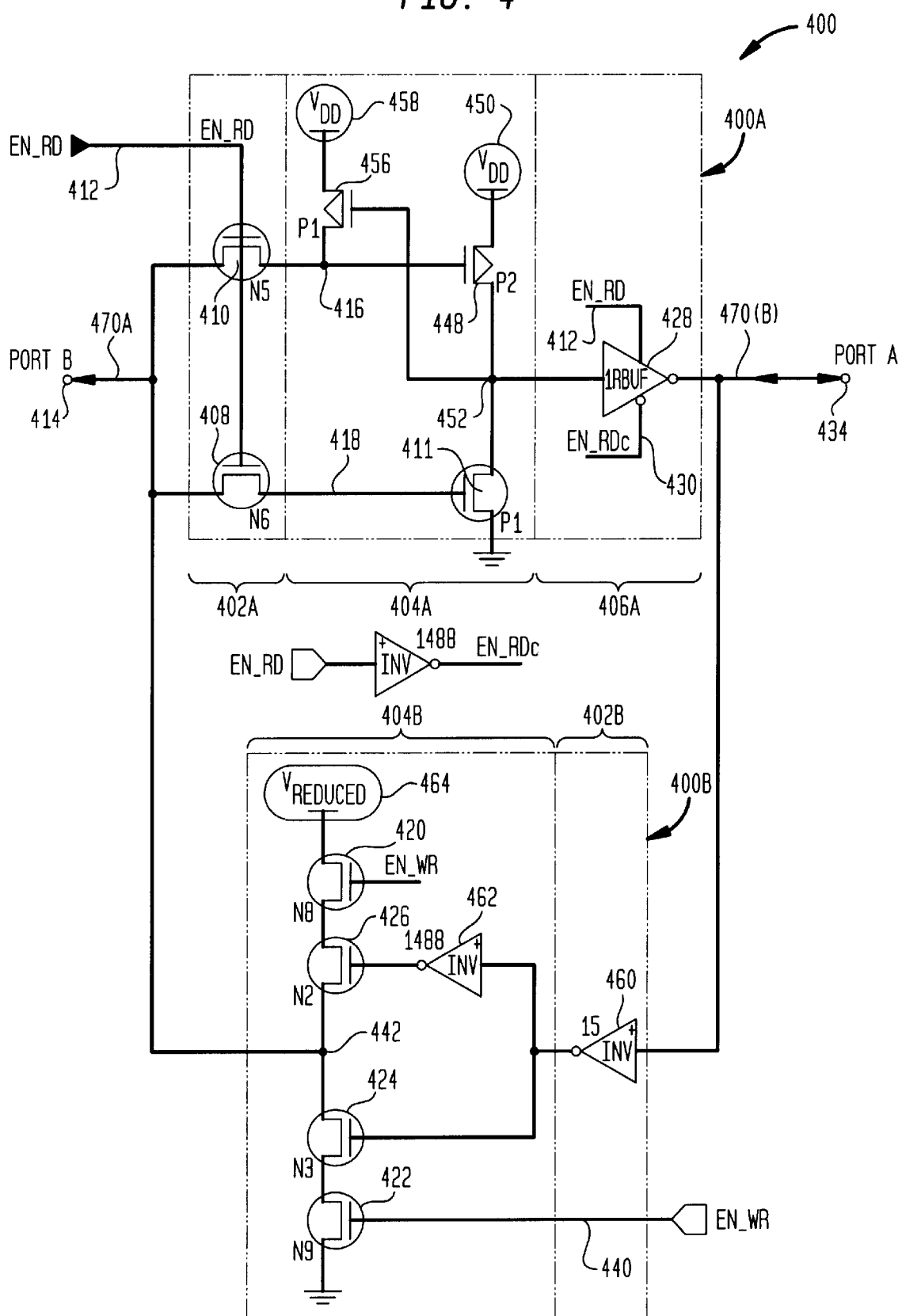
FIG. 4 illustrates, in greater detail and in accordance with one embodiment of the present invention, a mixed swing voltage bi-directional tri-state buffer circuit, capable of functioning as a mixed swing voltage bi-directional repeater circuit.

FIG. 4 illustrates, in greater detail and in accordance with one embodiment of the present invention, a bi-directional mixed swing voltage repeater circuit 400 that includes two unidirectional mixed swing voltage repeaters circuits 400A and 400B. Circuit 400A represents a non-inverting tri-state buffer capable of accepting a reduced voltage input and driving a load with its full swing voltage output to function as a unidirectional mixed swing repeater or a building block of a bi-directional mixed swing repeater. In an analogous manner, circuit 400B represents a non-inverting tri-state buffer capable of accepting a full swing voltage input and driving a load with its reduced voltage output to function as a mixed swing voltage unidirectional repeater or a building block of a mixed swing voltage bi-directional repeater. As shown in FIG. 4, the output of tri-state buffer 400A is coupled to the input of tri-state buffer 400B, forming PORT A. Likewise, the output of tri-state buffer 400B is coupled to the input of tri-state buffer 400A, forming PORT B.

In operation, when control signal EN_RD is enabled (e.g. logical high), bi-directional tri-state buffer 400A functions as a unidirectional repeater which receives a reduced voltage signal from PORT B and outputs the corresponding full swing voltage signal at PORT A. At the same time, control signal EN_WR goes low (When EN_RD is high) essentially tri-stating buffer circuit 400B and decoupling it from PORT B and/or PORT A. In this case, the entire bi-directional repeater circuit of FIG. 4 functions as a unidirectional repeater which converts a reduced voltage signal received at PORT B to the corresponding full swing voltage outputted at PORT A (i.e., left to right of FIG. 4).

In the reverse direction, in an analogous manner when control signal EN_WR is high, tri-state buffer 400B functions as a unidirectional repeater which receives a full swing voltage signal from PORT A and outputs the corresponding reduced voltage signal at PORT B. In this situation, control signal EN_RD goes low, essentially tri-stating buffer circuit 400A and decoupling it from PORTA and/or PORTB. In general, the enable signals EN_RD and EN_WR are preferably valid before the data arrives at the repeater to prevent signal transmission delay.

Buffer circuit 400A includes an input stage 402A, a level shifting stage 404A, and an output stage 406A. Input stage 402A includes n-type field effect transistors (FETs) 408 and 410, whose gates are controlled by buffer enable signal EN_RD on conductor 412. Note that buffer enable signal EN_RD and its complement EN RDc are optional and may be tied high and low respectively without impacting the ability of the circuit 400A to function as a basic reduced voltage input/full swing voltage output unidirectional buffer/repeater. The reduced voltage input signal is received at buffer input node 414 and passed by FETs 408 and 410 to nodes 416 and 418 when the buffer enable signal is enabled (i.e., when signal EN_RD is high).

Level shifting stage 404A receives the signals from input stage 402A and shifts the received signals to a higher voltage range. Depending on the value of the reduced voltage input signal on input node 414, output stage 406A outputs either a logical low ($V_{SS}$) or a logical high (the high value of the full swing range, or $V_{DD}$ herein). Accordingly, a reduced voltage input/full voltage output buffer/repeater circuit is formed.

It should be noted that although FETs 408, 410 and 411 are represented in the drawing as low-threshold n-FETs (the low threshold characteristic is represented by the circle surrounding the transistor symbol), such is not a requirement as long as the threshold voltage of these input transistors is lower than the input voltage range. Low threshold transistors are, however, preferred (but not required) for these transistors. In general, low threshold FETs may have a lower threshold voltage (e.g., about 0.4 V to about 0.5 V) than typical FETs (which may be around 0.6 V–0.7 V).

Similarly, buffer circuit 400B includes an input stage 402B, a combined level shifting stage/output stage 404B. Level shifting stage 404B includes n-type field effect transistors (FETs) 420 and 422, whose gates are controlled by a buffer enable signal EN_WR. Note that buffer enable signal EN_WR is optional and may be tied high without impacting the ability of the circuit 400B to function as a basic full voltage input/reduced voltage output unidirectional buffer/repeater.

The full swing voltage input signal is received at input node 434 and passed to n-type FETs 424 and 426. When the buffer enable signal EN_WR is enabled, depending on the value of the full swing voltage input signal on input node 434, output stage 404B outputs either a logical low ($V_{ss}$) or a reduced voltage logical high (the high value of the reduced voltage range, or $V_{REDUCED}$ herein). Accordingly, a full swing voltage input/reduced voltage output buffer/repeater circuit is formed.

Like transistors 408, 410 and 411 of circuit 400A, transistors 420, 422, 424, and 426 in circuit 400B are represented in the drawing as low-threshold n-FETs (the low threshold characteristic is represented by the circle surrounding the transistor symbol). Although low threshold transistors are preferred for these output transistors for optimum performance, transistors which may have a more typical threshold voltage range may also be employed.

To facilitate further understanding, the operation of mixed swing bi-directional repeater 400 will now be explained in detail. Consider the situation wherein both buffer enable signals EN_RD and EN_WR are disabled to permit tri-state buffers 400A and 400B to enter the tri-state mode. In the circuit of 400A, the tri-state mode is entered when signal EN_RD on conductor 412 is low. With low signal EN_RD, n-type FETs 408 and 410 are off, thereby preventing the signal at input node 414 from being passed to level shifting stage 404A. Note that tri-state inverter 428 is operated with an upper power level equal to $V_{DD}$. When EN_RD is disabled (logical low) a signal EN_RDc (which is the inverse of signal EN_RD) would be high on conductor 430, thereby putting tri-state inverter 428 in a high impedance state and decoupling the tri-state inverter 428 output from its input. Thus, buffer/repeater 400A would enter a tri-state mode disconnecting both the input and output stages (402A and 406A) from the level shifting stage 404A. Similarly, in the circuit of 400B, when signal EN_WR is low, n-type FETs 420 and 422 are off, thereby putting node 442 in a high impedance state with respect to node 414.

When buffer circuit 400A is not tri-stated, (signal EN_RD is enabled) consider the situation where a $V_{SS}$ (logical low) voltage level appears on node 414. The high signal EN_RD causes FETs 408 and 410 to turn on, passing the $V_{SS}$ voltage level to nodes 418 and 416 respectively. Since FET 410 conducts, node 416 goes low to turn on p-type FET 448, thereby pulling node 452 to $V_{DD}$ (by $V_{DD}$ voltage source 450). Since EN_RD is high and its inverted EN_RDc signal is low, tri-state inverter 428 passes the inverted value of node 452 to node 434, causing node 434 to go low (since tri-state inverter 428 inverts its output relative to its input).

Now, consider the situation when signal EN_RD is high (i.e., buffer circuit 400A is not tri-stated) and a $V_{REDUCED}$ voltage level (logical high) appears on input node 414. The high signal EN_RD causes FETs 408 and 410 to turn on, passing the $V_{REDUCED}$ voltage level to nodes 418 and 416 respectively. Since FET 408 conducts, the $V_{REDUCED}$ voltage level is passed to node 418, thereby turning on FET 411 to pull node 452 to $V_{SS}$ When node 452 is pulled to $V_{SS}$, p-FET 456 is fully on to pull node 416 to about $V_{DD}$ (by $V_{DD}$ voltage source 458). Thus node 416 is at about $V_{DD}$ although the conduction of FET 410 causes $V_{REDUCED}$ to be passed to node 416 from input node 414.

Since node 416 is at about $V_{DD}$, this full $V_{DD}$ voltage is applied to the gate of p-FET 448 to turn FET 448 fully off, thereby decoupling node 452 from $V_{DD}$ voltage source 450 and ensuring that node 452 stays at the $V_{SS}$ level. With signal EN_RD high and its inverted signal EN_RDc low, the $V_{SS}$ value on node 452 causes node 434 to go to $V_{DD}$. (since tri-state inverter 428 would be enabled to output the inverted value of its input).

With respect to circuit 400B, consider the situation when signal EN_WR is enabled (logical high) and a $V_{SS}$ voltage level (logical low) appears on node 434. The $V_{SS}$ voltage will turn on n-type FET 424 because of the inverting action of inverter 460. N-type FET 426 would be off because of the inverting actions of inverters 460 and 462. With FET 426 off, node 442 would be disconnected from a reduced voltage source 464. Also in this situation, FET 422 would be on since EN_WR signal is a logical high. With FETs 422 and 424 both on, node 442 would be connected to ground through FETs 422 and 424. Thus a $V_{SS}$ voltage would be outputted on conductor 414.

In an analogous manner, when signal EN_WR is a logical high and a $V_{DD}$ voltage level (logical high) appears on node 434, FET 424 would be off (because of the inverting action of inverter 460) disconnecting node 442 from FET 422 and the ground. However, FET 426 would be on. With EN_WR signal high, FET 420 would also be on to connect node 442 to the reduced voltage source 464. Thus, a $V_{REDUCED}$ voltage level (logical high) would outputted on conductor 414.

In the example of FIG. 4, FETs 420, 422, 424, and 426 perform not only the function of a level shifter stage by shifting the voltage level of the input signal from a full swing voltage range to a reduced voltage range, it also controls the outputting of the reduced voltage signal on node 414. In this case, the output stage may be considered either integrated with the level shifter stage or it may be considered omitted from this buffer circuit 400B. Thus, the presence of the output stage is not absolutely critical in all cases although it may be highly advantageous in some of the embodiments discussed herein.

It should also be noted that although both buffer circuits 400A and 400B are configured as non-inverting tri-state buffer circuits, such is not a requirement. Accordingly, the inventions herein are not necessarily limited to the inverting (or non-inverting) feature of the mixed swing voltage tri-state buffer circuits. In addition, although in order to facilitate understanding and ease of comparing different embodiments, all the enable signals in FIG. 4 and the following figures are shown as EN_RD and EN_WR, (suggesting RWD application) it should be understood that the inventions herein can also be applied to other applications and the inventions herein are not necessarily limited to bi-directional RWD lines.

By using control signals having the full voltage swing ($V_{SS}$–$V_{DD}$) to control gates of FETs 420, 422, 424, and 426 in circuit 400B, a higher overdrive voltage is obtained to turn on and off these FETs. If a reduced voltage $V_{REDUCED}$ had been employed to control gates of these output FETs, the FETs would need to be larger to source/sink the same amount of current in the same amount of time. Because the invention can be employed with control signals having the full voltage swing ($V_{SS}$–$V_{DD}$) to control gates of output FETs 4420, 422, 424, and 426, these FETs may be made smaller, which reduces space usage on a chip.

Reducing the size of the output FETs also reduces the capacitive load to which the buffer circuit is coupled. This is advantageous in applications wherein multiple buffer circuits are employed to assert signals on a common bus conductor and multiple buffer circuit output stages may be coupled to that same common bus. By reducing the size and capacitance associated with the output FETs of the output stage in each buffer circuit, less load capacitance is presented to the buffer circuit that actually drives the bus conductor. With reduced load capacitance, latency and power consumption is advantageously reduced.

Figure 5:
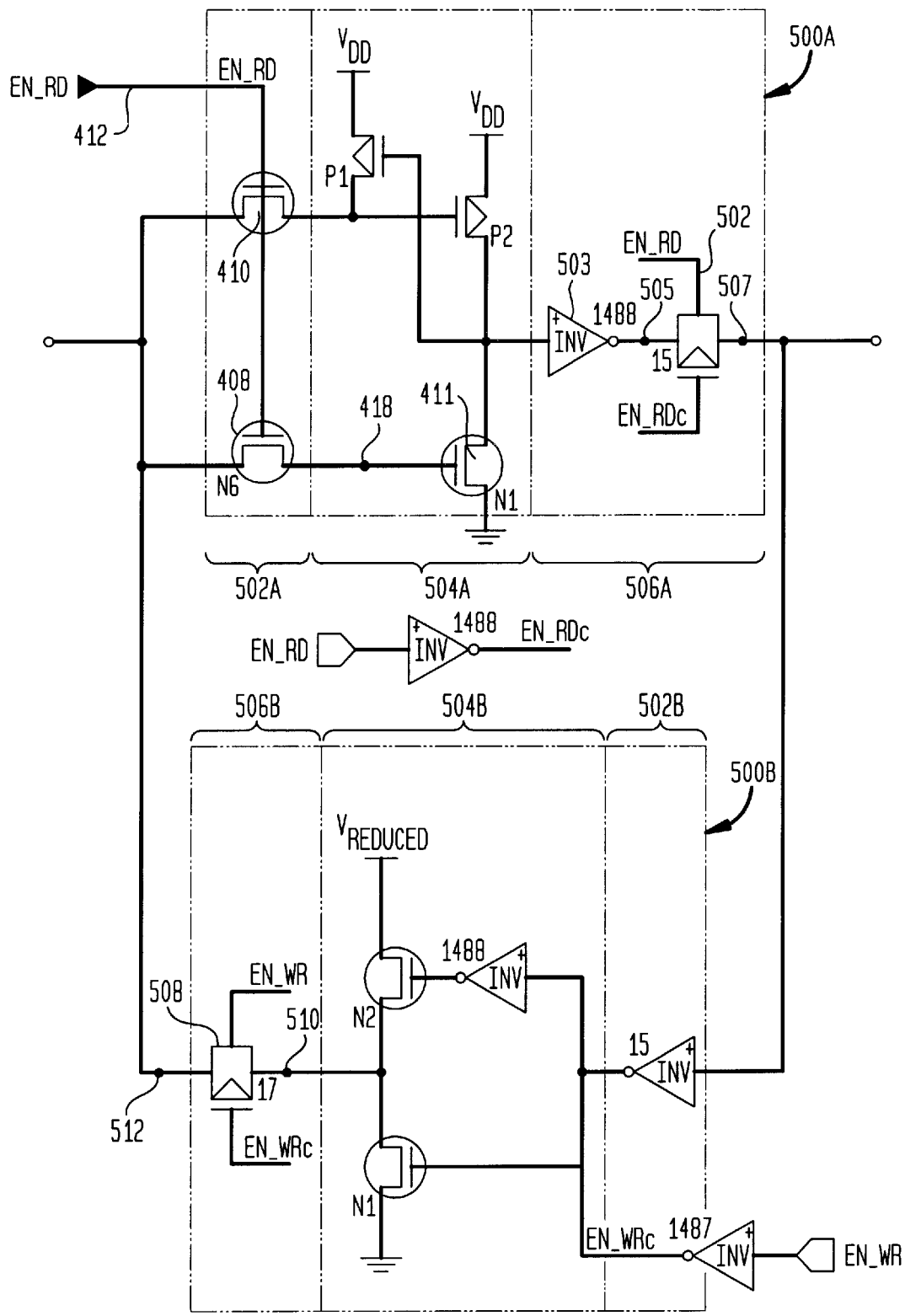
FIGS. 5–7 illustrate, in accordance with various embodiments of the present invention, various alternative configurations of a mixed swing voltage bi-directional tri-state buffer circuit, capable of functioning as a mixed swing voltage bi-directional repeater circuit.
Figure 6:
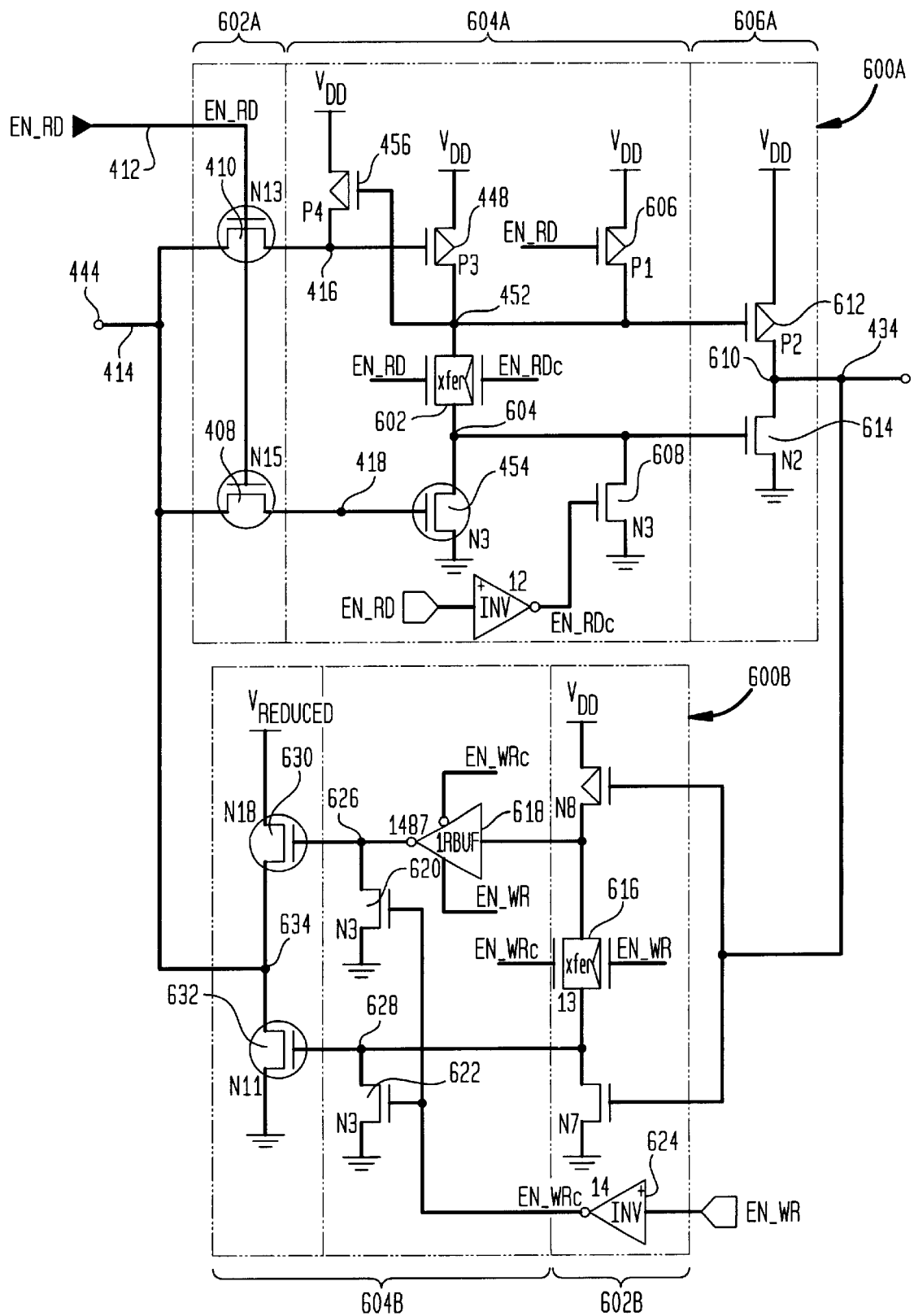
Figure 7:
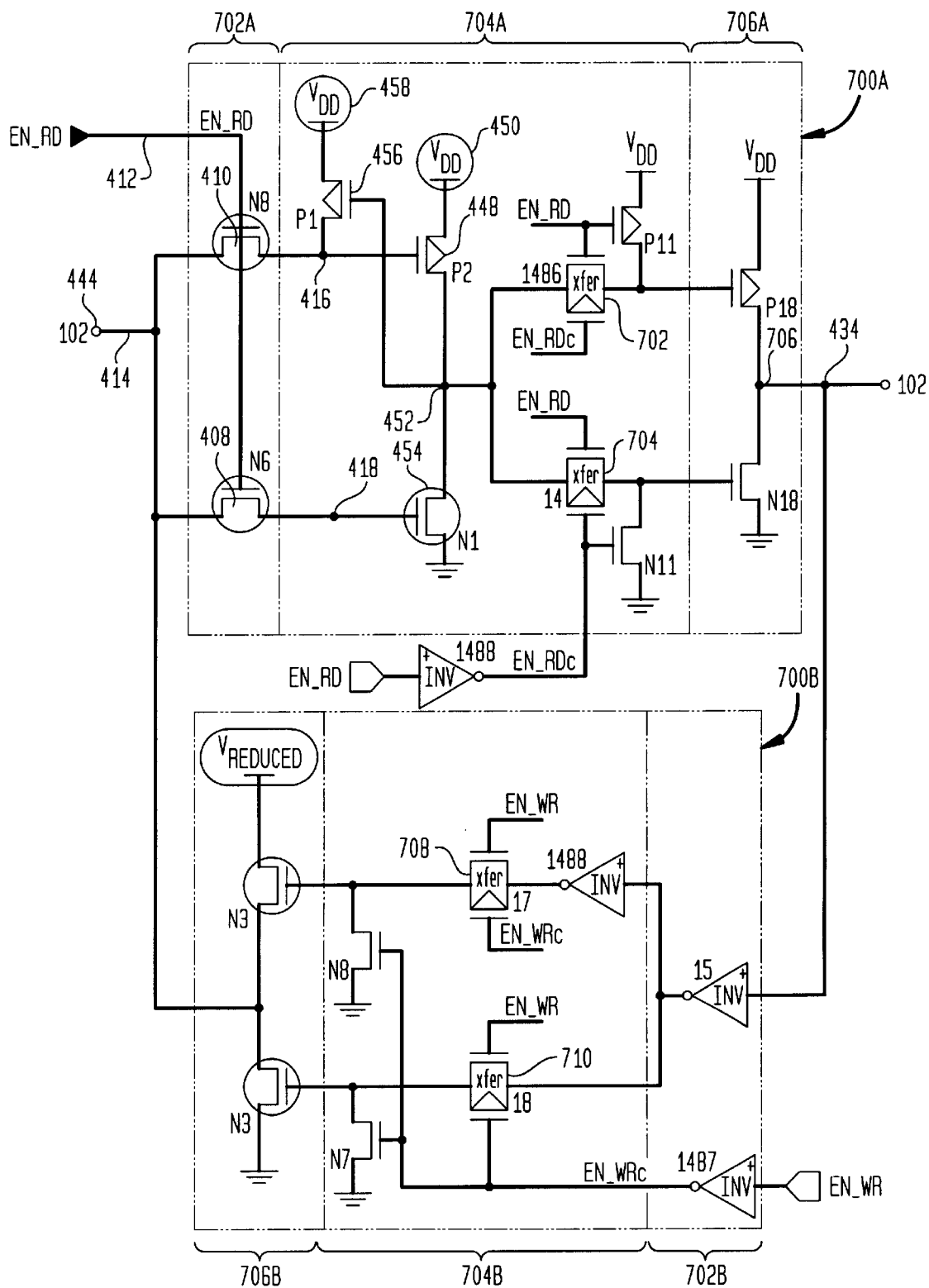

FIGS. 5–7 depict various alternative embodiments for mixed swing voltage bi-directional repeater circuits, showing the various exemplary manners in which the input stage, the level shifting stage, and the optional output stage may be configured for each unidirectional repeater circuit.

In each of these FIGS. 5–7, the mixed swing voltage bi-directional repeater circuit includes two mixed swing voltage unidirectional repeater circuits, one depicted at the top and one depicted at the bottom of each figure. The unidirectional repeater circuits depicted at the top of each figure can accept a reduced voltage signal from the left side of the figure and output the corresponding full swing voltage to the right of the figure. In an analogous manner, the unidirectional repeater circuits depicted at the bottom of each figure can accept a full swing voltage signal from the right side of the figure and output the corresponding reduced voltage signal to the left of the figure.

The level shifting stage for the unidirectional repeater on top portion of each of the FIGS. 5–7 is employed to boost the reduced voltage input signal into control signals having a greater voltage range and to output this greater voltage range to the output stage. The level shifting stage for the unidirectional repeater circuits at the bottom portion of each of the FIGS. 5–7 is employed to generate control signals that drive the output stage which in turn outputs the corresponding reduced voltage values. The output stages of the unidirectional repeater circuits at the bottom portion of FIGS. 5–7 include transistors that are connected in series between $V_{REDUCED}$ and $V_{SS}$ to output signals in a reduced voltage range. As mentioned before, with these output transistors turned on and off by the higher voltage control signals, the transistors at the output stage can advantageously source or sink a greater amount of current to drive the load with reduced latency.

In FIG. 5, the output stage 506A of a unidirectional repeater circuit 500A includes a transmission gate 502 and an inverter 503 instead of a tri-state inverter (such as 428 as in the case of FIG. 4). Transmission gate 502 functions to pass the voltage between nodes 505 and node 507, responsive to control signal EN_RD and its complement EN_RDc. Additionally, another transmission gate 508 is employed in the output stage 506B of unidirectional repeater circuit 500B. Transmission gate 508 functions to pass the voltage between nodes 510 and node 512, responsive to control signal EN_WR and its complement EN_WRc. Similar to circuit of FIG. 4, transmission gates 502 and 508 may be employed to tri-state circuits 500A and 500B respectively. In this particular implementation, the enable signal EN_WR has been employed to control the outputting stage 506B of circuit 500B. The remainder of the circuit of FIG. 5 functions roughly in an analogous manner to the circuit of FIG. 4, and the operation of the buffer of FIG. 5 is readily understandable to one skilled in the art in view of this disclosure.

In FIG. 6, the level shifting stage 604A of the unidirectional repeater circuit 600A includes a transmission gate 602. Transmission gate 602 can be implemented between nodes 452 and 604 to pass the voltage between its two nodes, (i.e., between nodes 452 and node 604, responsive to control signal EN_RD). In the particular embodiment depicted in FIG. 6, the output stage 606A of the unidirectional repeater circuit 600A includes FET's 612 and 614 connected in series between $V_{DD}$ and $V_{SS}$. In addition, two FETs 606 and 608 are employed to tri-state the level shifting stage 604A from the output stage 606A responsive to control signal EN_RD. That is, when enable control signal EN_RD is disabled (logical low) both FETs 606 and 608 would be on, causing both FET's 612 and 614 to turn off (a logical high would be at the gate of FET 612 and a logical low at the gate of FET 614). Thereby, node 610 would be in a state of high impedance with respect to node 434. In this manner, when control signal EN_RD is enabled, the full swing voltage signal corresponding to the reduced voltage signal inputted at node 444 can be outputted at node 434.

Furthermore, the unidirectional repeater circuit 600B includes a transmission gate 616 that is implemented in the input stage 602B. Transmission gate 616 can pass on the input voltages to the combined output/level shifting stage 604B responsive to enable control signal EN_WR and its complement. Additionally a tri-state inverter buffer 618 and FET's 620 and 622 have been employed in the level shifting stage 604B of circuit 600B to control the propagation of voltages from the input stage to output stage, responsive to enable control signal EN_WR and its complement. To facilitate further understanding, if control enable signal EN_WR is disabled (logical low) because of inverter 624 both n-FET's 620 and 622 would be on, pulling nodes 626 and 628 to ground respectively. Thus, both n-FET 630 and 632 would be off so that node 634 would have high impedance with respect to node 444.

If control enable signal EN_WR is enabled, tri-state inverter buffer 618 would be on to pass the full swing voltage input values from node 434 to output stage 606B so that corresponding reduced voltage values can be outputted by the output stage. The output stage of the unidirectional repeater circuit 600B includes FET's 630 and 632 connected in series between $V_{REDUCED}$ and $V_{SS}$. Again, in a similar manner as discussed with respect to FIGS. 4 and 5, when the control signal EN_WR is enabled, (logical high) the reduced voltage corresponding to the full voltage received at node 434 can be outputted at node 444. The remainder of the circuit of FIG. 6 functions roughly in an analogous manner to the buffers of FIGS. 4 and 5, and the operation of these buffers is readily understandable to one skilled in the art in view of this disclosure.

In FIG. 7, the level shifting stage 704A of the unidirectional repeater circuit 700A includes two transmission gates 702 and 704 that are implemented between nodes 452 and 706. Transmission gates 702 and 704 can pass voltages between nodes 452 and node 706, responsive to control signal EN_RD and its complement. Similarly, unidirectional repeater circuit 700B includes two transmission gates 708 and 710 in level shifting stage 704B. The remainder of the circuit of FIG. 7 functions roughly in an analogous manner to the buffer of FIGS. 4–6, and the operation of these buffers is readily understandable to one skilled in the art in view of this disclosure.

As mentioned earlier, any of the buffers disclosed herein may be employed as mixed swing bi-directional repeater (or unidirectional repeaters) to reduce, among others, the propagation delay associated with high capacitance and/or high resistance associated with bi-directional (or unidirectional) signal lines.

Figure 8A:
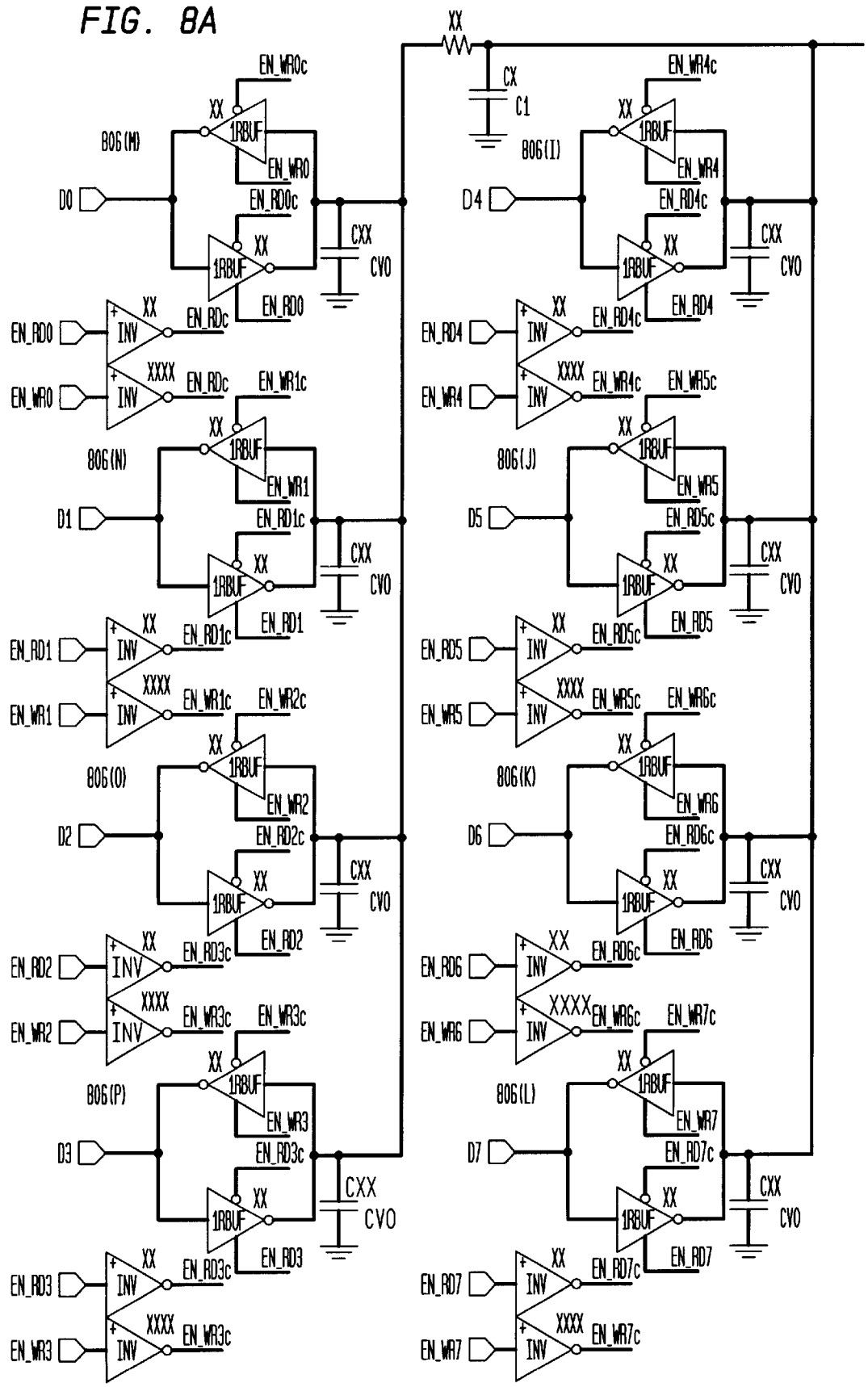
FIG. 8 illustrates, to facilitate discussion, a diagrammatic representation of an exemplary DRAM architecture, including a RWD line.
Figure 8B:
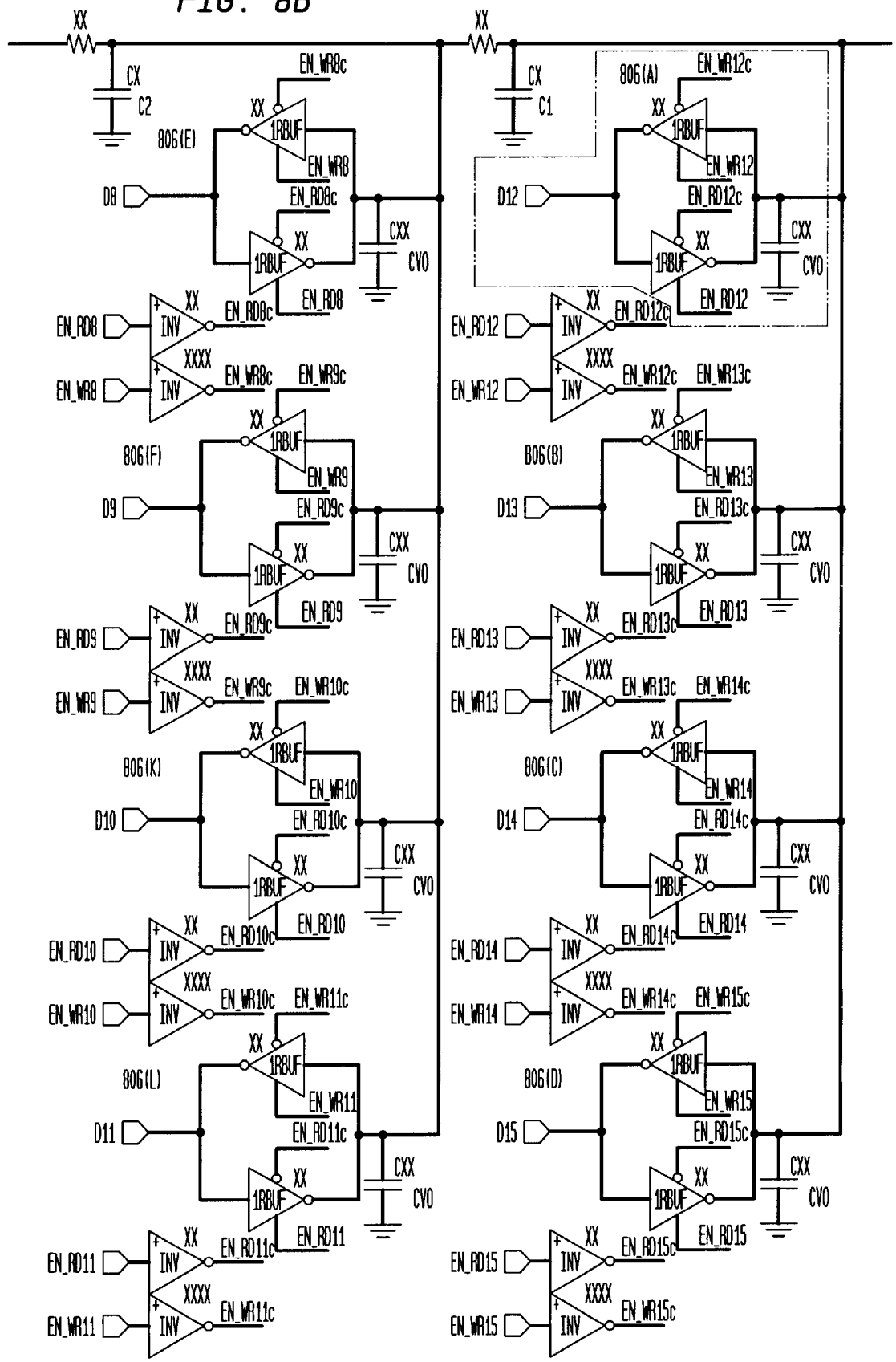
Figure 8C:
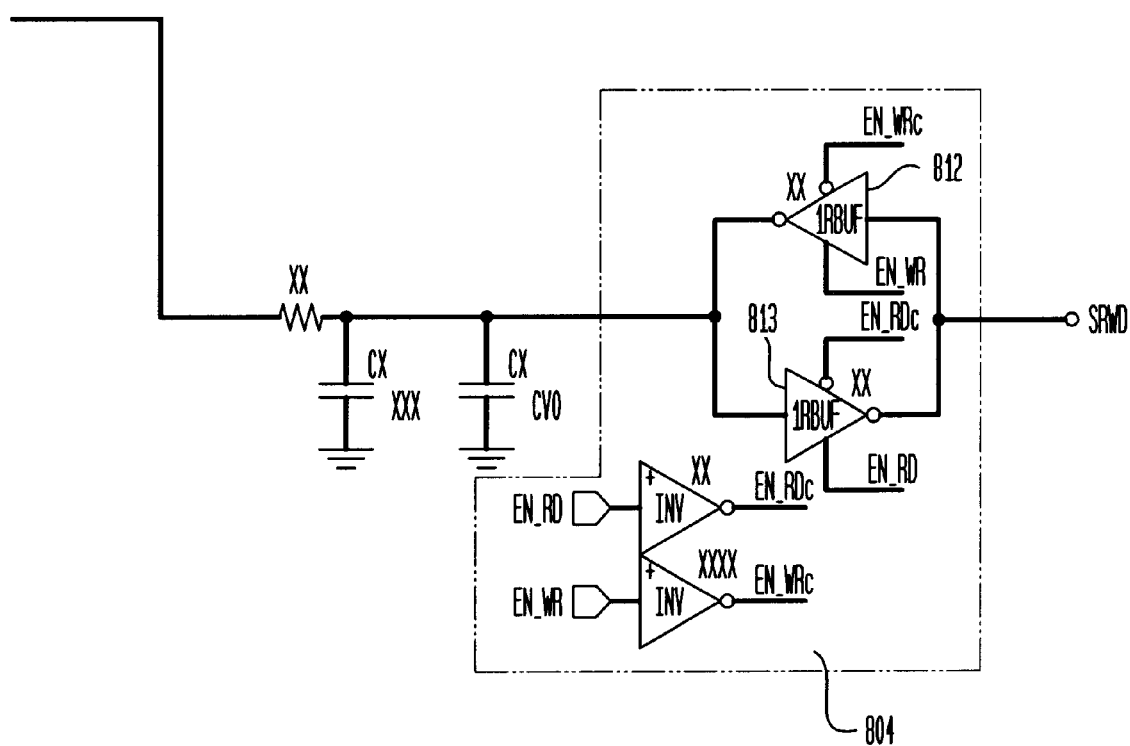

To facilitate discussion of the application of the bi-directional repeater of the present invention in a modern high density integrated circuit, FIG. 8 illustrates, a diagrammatic representation of an exemplary DRAM architecture, which shows a RWD line 802 coupled to a driver/receiver pair 804 and to each of the sixteen abstract driver/receiver pairs 806(a)–(p). In FIG. 8, the tri-state buffer within outline 840 represents the generalized driver/receiver circuit. In this example, each of driver/receiver pairs 806(a)–(p) represents the driver/receiver pair associated with a second sense amplifier, i.e., the sense amplifier that is employed to further amplify the signal from a cell after that signal has been amplified once by a first sense amplifier.

Data lines D0–D15 from each of the cells represents the data to be read from or written to the cells, or more specifically to the first sense amplifier associated with the cell depending on the state of the signals that control drivers 808 and 810 associated with each of these driver/receiver pairs 806. If data is to be written to the cell that is coupled to data line D12, for example, the bit of data may be received by driver/receiver pair 804 and driven onto RWD line 802. Driver 804 (or more specifically driver 812 wherein) is turned on to pass the data to 808, which then drives the data onto data line D12 to be written to the cell. If data is to be read from the cell that is coupled to data line D12, for example, the bit of data may be received by driver/receiver pair 806(a) and driven onto RWD line 802. Driver/receiver pair 804 (or more specifically driver 813 therein) is turned on to pass the data from data line D12 to a FIFO or off-chip driver circuit.

As can be seen, RWD line 802 is a bi-directional line that is employed to pass data from off chip to one of the cells or from one of the cells to a FIFO or off-chip driver circuit and ultimately off chip. Note that for simplicity the FIFO and/or off-chip driver circuits have been omitted. With reference to FIG. 8, each driver/receiver pair 806 has associated with it a capacitor 820, representing the capacitive load of that driver/receiver pair 806 as seen from RWD line 802 and includes the input capacitance of driver 808 as well as the output capacitance of driver 810. RWD line 802 then has a capacitive load distributed along its length that includes the capacitance associated with each of the driver/receiver pair 806 as well as the capacitance of the RWD line itself. Furthermore, RWD line 802 is a long signal line and tends to have a significant resistance along its length, particularly between driver/receiver pair 806 (such as driver/receiver pair 806(p)) and driver/receiver pair 804. The large resistance and capacitance associated with RWD line 802 degrades performance both when writing to a cell and when reading therefrom.

Figure 9A:
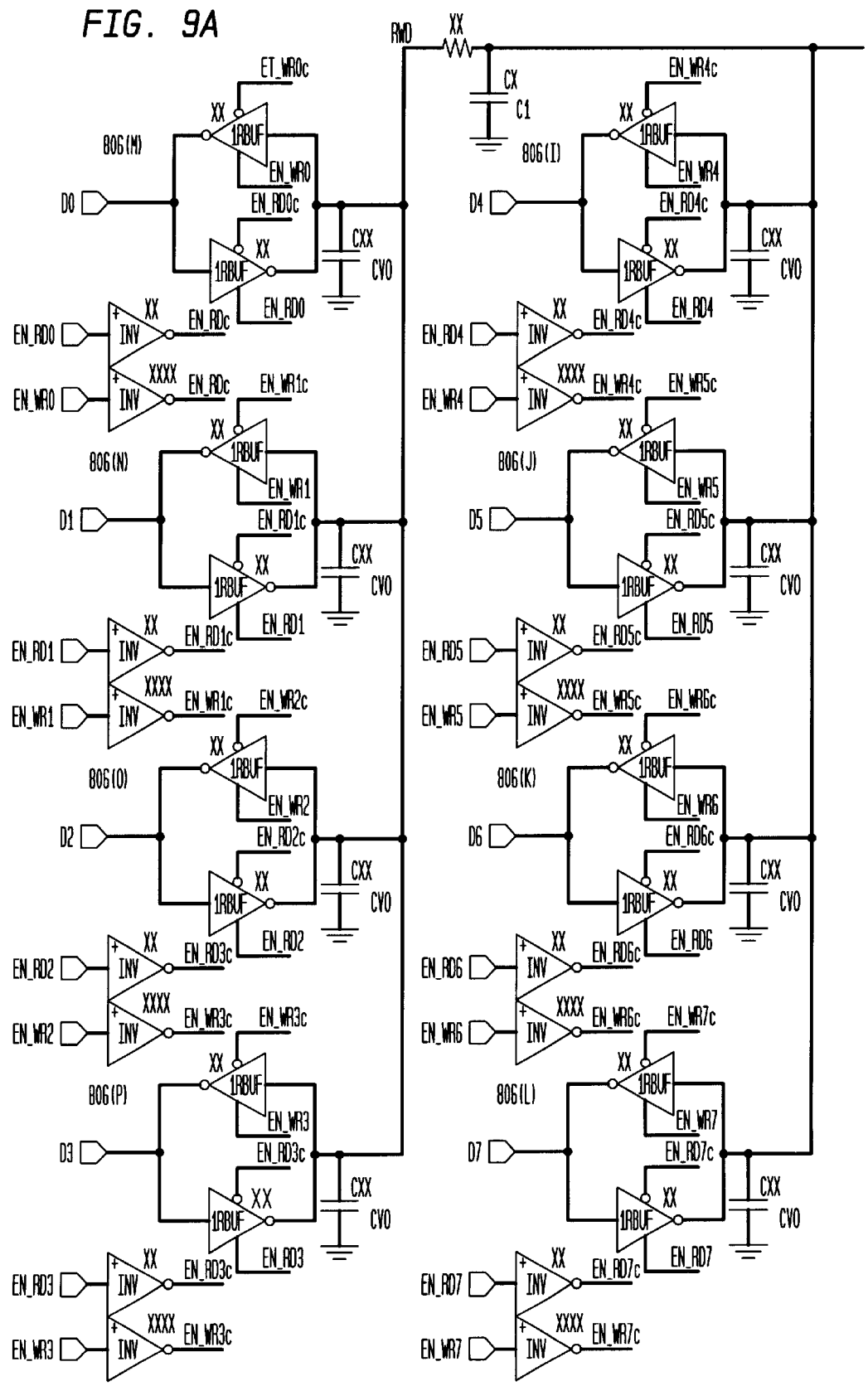
FIG. 9 illustrates, a diagrammatic representation of the DRAM architecture of FIG. 8, including a bi-directional repeater implemented on the RWD line in accordance with one embodiment of the present invention.
Figure 9B:
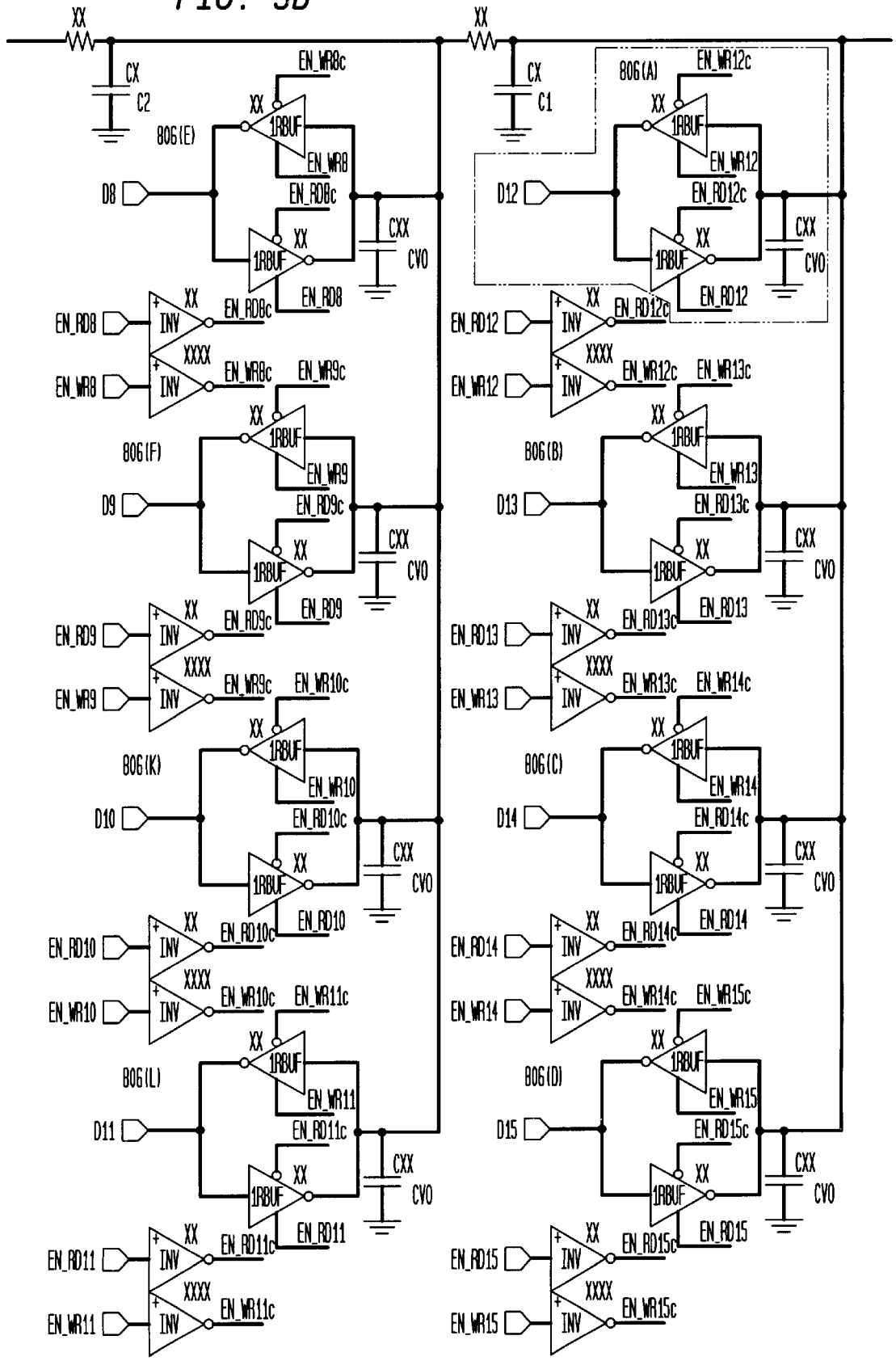
Figure 9C:
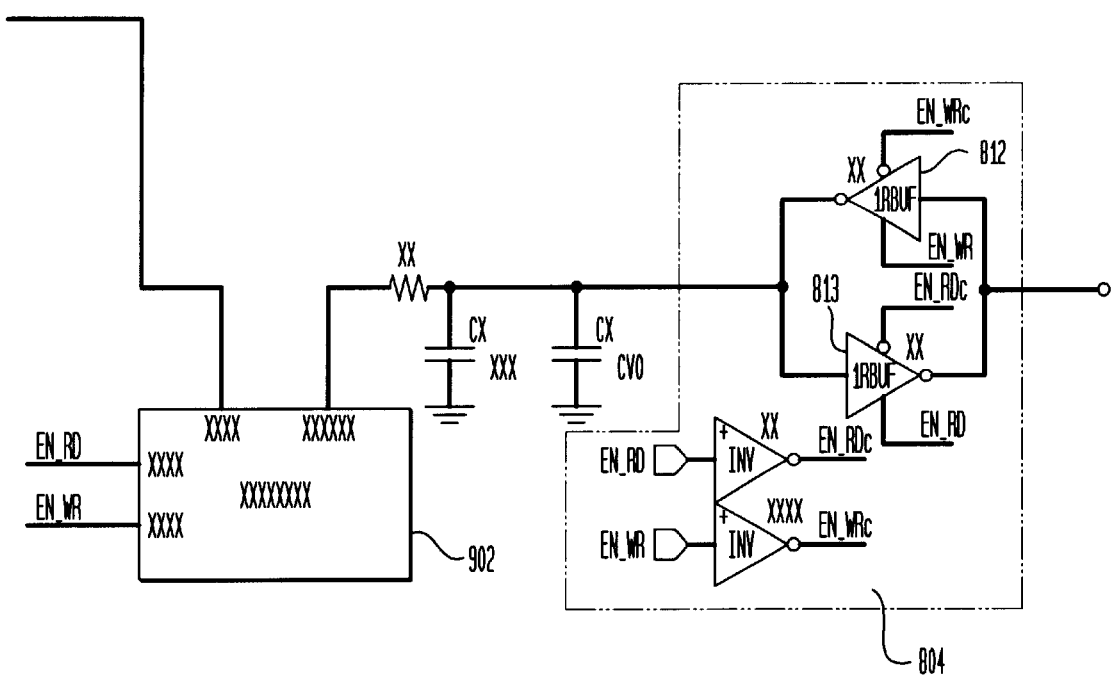

FIG. 9 shows, in accordance with one embodiment of the present invention, the DRAM circuit portion of FIG. 8, including a bi-directional repeater 902 disposed in between driver/receiver pair 804 and the driver/receiver pairs of the cell array.

Bi-directional repeater 902 is preferably disposed such that it is positioned on RWD line 802 between driver/receiver pair 804 and all reduced voltage driver/receiver pairs 806. That is, it is preferable that any data written to or read from a driver/receiver pair 806 via the RWD line traverses the bi-directional repeater. When so disposed, bi-directional repeater 902 serves to decouple a portion of the capacitance associated with RWD line 802 to improve performance during reading and writing. It should be noted, however, that FIG. 9 is not drawn to scale, e.g., in DRAMs, the resistance Rx representing the resistance of a spine RWD can be substantial, i.e., R1R2+R3. Further, the presence of bi-directional repeater 902 reduces the amount of resistance seen by driver 810 of driver/receiver pair 806 when reading data and reduces the amount of resistance seen by driver 812 of driver/receiver pair 804 when writing data to the cell.

In the view of foregoing, the use of the repeater of the present invention advantageously reduces the propagation delay associated with high capacitance, high resistance load lines. Furthermore, the use of the repeater of the present invention at strategic locations on the high capacitive load, high resistance lines advantageously improves signaling, i.e., improving the rise and fall edges to counteract the attenuation effects and/or propagation lo delay of the signal line. The improvement of the rise and fall times is essential to realize high bandwidth data transfer. Without this improvement, the timing window for which the transmitted data is valid is reduced and consequently the frequency at which the bus can be run is limited. If a mixed swing voltage unidirectional or bi-directional repeater is implemented on an integrated circuit (such as a DRAM, a microprocessor, a DSP chip, or the like) that also employs reduced voltage signals at one node, further advantages in terms of power dissipation, electrical noise, electromigration, and chip area usage are also realized.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In an integrated circuit, a method for implementing a mixed swing voltage repeater circuit on a signal line having thereon reduced voltage signals, said reduced voltage signals having a voltage level that is below a full swing voltage level, said full swing voltage level representing an internal voltage level at which said integrated circuit operates, said mixed swing voltage repeater circuit being configured to be coupled to said signal line and having an input node coupled to a first portion of said signal line for receiving a first reduced voltage signal and an output node coupled to a second portion of said signal line for outputting a full swing voltage signal, comprising:

coupling said input node to said first portion of said signal line, said input node being coupled to an input stage of said mixed swing voltage repeater circuit, said input stage being configured to receive said first reduced voltage signal on said signal line, said input stage is also coupled to a level shifter stage that is arranged to output at least one level shifter stage control signal responsive to said first reduced voltage signal, a voltage level of said at least one level shifter stage control signal being higher than a voltage level associated with said first reduced voltage signal; and coupling said output node to said second portion of said signal line, said output node also being coupled to an output stage of said mixed swing voltage repeater circuit, said output stage being configured to output said full swing voltage signal on said output node responsive to said at least one level shifter stage control signal.

2. The method of claim 1 further comprising receiving a repeater enable signal, said repeater enable signal, when enabled, permits said output stage to output said full swing voltage signal on said output node responsive to said at least one level shifter stage control signal, said repeater enable signal, when disabled, decouples said output node from said input stage and said level shifter stage.

3. The method of claim 1 wherein said input stage includes a first field-effect transistor and a second field-effect transistor, gates of said first and second field-effect transistors being configured to receive said first reduced voltage signal, said first and second field effect transistors having a threshold voltage level that is lower than said voltage level associated with said first reduced voltage signal.

4. The method of claim 3 further comprising receiving a repeater enable signal, first terminals of said first and second field-effect transistors are coupled to receive said repeater enable signal.

5. The method of claim 3 wherein second terminals of said first and second field-effect transistors are coupled to respective first and second input nodes of said level shifter stage.

6. The method of claim 5 wherein said level shifter stage includes a third field-effect transistor, a fourth field-effect transistor, and a fifth field-effect transistor,
- a gate of said third field-effect transistor being coupled to said first input node of said level shifter stage and a first terminal of said fourth field-effect transistor, a first terminal of said third field-effect transistor being coupled to $V_{DD}$,
- a gate of said fourth field-effect transistor being coupled to a second terminal of said third field-effect transistor and a first terminal of said fifth field-effect transistor, a second terminal of said fourth field-effect transistor being coupled to $V_{DD}$,
- a gate of said fifth field-effect transistor being coupled to said second input node of said level shifter stage, a second terminal of said fifth field-effect transistor being coupled to $V_{SS}$.

7. The method of claim 6 wherein said third and fourth field-effect transistors represent p-type field-effect transistors, said first, second, and fifth field-effect transistors represent n-type field-effect transistors.

8. The method of claim 7 wherein said output stage includes
- an inverting triestate buffer circuit, a first terminal of said inverting tristate buffer circuit being coupled to said second terminal of said third field-effect transistor and said first terminal of said fifth field-effect transistor, a second terminal of said inverting tristate buffer circuit being coupled to said output node, a third terminal of said inverting tristate buffer circuit being coupled to receive said repeater enable signal.

9. The method of claim 7 wherein said output stage includes
- an inverter having an inverter input and an inverter output, said inverter input being coupled to said second terminal of said third field-effect transistor and said first terminal of said fifth field-effect transistor,
- a transmission gate having a first transmission gate terminal coupled to said inverter output of said inverter, a second transmission gate terminal coupled to said output node, a third transmission gate terminal coupled to receive said repeater enable signal.

10. The method of claim 5 wherein said level shifter stage and said output stage include a third field-effect transistor, a fourth field-effect transistor, a fifth field-effect transistor, and a transmission gate,
- a gate of said third field-effect transistor being coupled to said first input node of said level shifter stage and a first terminal of said fourth field-effect transistor, a first terminal of said third field-effect transistor being coupled to $V_{DD}$,
- a gate of said fourth field-effect transistor being coupled to a second terminal of said third field-effect transistor and a first terminal of said transmission gate, a second terminal of said fourth field-effect transistor being coupled to $V_{DD}$,
- a gate of said fifth field-effect transistor being coupled to said second input node of said level shifter stage, a first terminal of said fifth field-effect transistor being coupled to $V_{SS}$,
- a second terminal of said transmission gate being coupled to receive said repeater enable signal, and a third terminal of said transmission gate being coupled to a second terminal of said fifth field-effect transistor.

11. The method of claim 10 wherein said third and fourth field-effect transistors represent p-type field-effect transistors, said first, second, and fifth field-effect transistors represent n-type field-effect transistors.

12. The method of claim 1 wherein said reduced voltage signals have a voltage level that is less than or equal to 1 V.

13. The method of claim 1 wherein said signal line represents an address line of a dynamic random access memory (DRAM) circuit.

14. The method of claim 1 wherein said signal line represents an address line of an integrated circuit.

15. The method of claim 1 wherein said signal line represents a read data line a memory circuit.

16. The method of claim 1 wherein said signal line represents a write data line a memory circuit.

17. The method of claim 1 wherein said signal line represents a clock line of an integrated circuit.

18. The method of claim 1 wherein said signal line represents a command line of an integrated circuit.

19. The method of claim 1 wherein said signal line represents a signal carrying conductor of an integrated circuit.

20. The method of claim 1 wherein said integrated circuit represents a microprocessor circuit.

21. A mixed swing voltage repeater circuit implemented in an integrated circuit, said mixed swing voltage repeater circuit being configured to be coupled to a signal line and having an input node coupled to a first portion of said signal line for receiving a first reduced voltage signal and an output node coupled to a second portion of said signal line for outputting a full swing voltage signal, said first reduced voltage signal having a voltage level that is below a full swing voltage level, said full swing voltage level representing an internal voltage level at which said integrated circuit operates, said mixed swing voltage repeater circuit comprising:
- an input stage having said input node, said input node being coupled to said first portion of said signal line, said input stage being configured to receive said first reduced voltage signal on said signal line;
- a level shifter stage coupled to said input stage, said level shifter stage being arranged to output at least one level shifter stage control signal responsive to said first reduced voltage signal, a voltage level of said at least one level shifter stage control signal being higher than a voltage level associated with said first reduced voltage signal; and
- an output stage having said output node, said output node being coupled to said second portion of said signal line, said output stage being configured to output said full swing voltage signal on said output node responsive to said at least one level shifter stage control signal.

22. The mixed swing voltage repeater circuit of claim 21 wherein said input stage includes a first field-effect transistor and a second field-effect transistor, gates of said first and second field-effect transistors being configured to receive said first reduced voltage signal, said first and second field effect transistors having a threshold voltage level that is lower than said voltage level associated with said first reduced voltage signal.

23. The mixed swing voltage repeater circuit of claim 22 wherein first terminals of said first and second field-effect transistors are coupled to receive a repeater enable signal, said repeater enable signal, when enabled, permits said output stage to output said full swing voltage signal on said output node responsive to said at least one level shifter stage control signal, said repeater enable signal, when disabled, decouples said output node from said input stage and said level shifter stage.

24. The mixed swing voltage repeater circuit of claim 22 wherein second terminals of said first and second field-effect transistors are coupled to respective first and second input nodes of said level shifter stage.

25. The mixed swing voltage repeater circuit of claim 24 wherein said level shifter stage includes a third field-effect transistor, a fourth field-effect transistor, and a fifth field-effect transistor, a gate of said third field-effect transistor being coupled to said first input node of said level shifter stage and a first terminal of said fourth field-effect transistor, a first terminal of said third field-effect transistor being coupled to $V_{DD}$, a gate of said fourth field-effect transistor being coupled to a second terminal of said third field-effect transistor and a first terminal of said fifth field-effect transistor, a second terminal of said fourth field-effect transistor being coupled to $V_{DD}$, a gate of said fifth field-effect transistor being coupled to said second input node of said level shifter stage, a second terminal of said fifth field-effect transistor being coupled to $V_{SS}$.

26. The mixed swing voltage repeater circuit of claim 25 wherein said third and fourth field-effect transistors represent p-type field-effect transistors, said first, second, and fifth field-effect transistors represent n-type field-effect transistors.

27. The mixed swing voltage repeater circuit of claim 26 wherein said output stage includes an inverting tristate buffer circuit, a first terminal of said inverting tristate buffer circuit being coupled to said second terminal of said third field-effect transistor and said first terminal of said fifth field-effect transistor, a second terminal of said inverting tristate buffer circuit being coupled to said output node, a third terminal of said inverting tristate buffer circuit being coupled to receive said repeater enable signal.

28. The mixed swing voltage repeater circuit of claim 26 wherein said output stage includes an inverter having an inverter input and an inverter output, said inverter input being coupled to said second terminal of said third field-effect transistor and said first terminal of said fifth field-effect transistor, a transmission gate having a first transmission gate terminal coupled to said inverter output of said inverter, a second transmission gate terminal coupled to said output node, a third transmission gate terminal coupled to receive said repeater enable signal.

29. The mixed swing voltage repeater circuit of claim 24 wherein said level shifter stage and said output stage include a third field-effect transistor, a fourth field-effect transistor, a fifth field-effect transistor, and a transmission gate, a gate of said third field-effect transistor being coupled to said first input node of said level shifter stage and a first terminal of said fourth field-effect transistor, a first terminal of said third field-effect transistor being coupled to $V_{DD}$, a gate of said fourth field-effect transistor being coupled to a second terminal of said third field-effect transistor and a first terminal of said transmission gate, a second terminal of said fourth field-effect transistor being coupled to $V_{DD}$, a gate of said fifth field-effect transistor being coupled to said second input node of said level shifter stage, a first terminal of said fifth field-effect transistor being coupled to $V_{SS}$, a second terminal of said transmission gate being coupled to receive said repeater enable signal, and a third terminal of said transmission gate being coupled to a second terminal of said fifth field-effect transistor.

30. The mixed swing voltage repeater circuit of claim 29 wherein said third and fourth field-effect transistors represent p-type field-effect transistors, said first, second, and fifth field-effect transistors represent n-type field-effect transistors.

31. The mixed swing voltage repeater circuit of claim 21 wherein said first reduced voltage signal have a voltage level that is less than or equal to 1 V.

32. The mixed swing voltage repeater circuit of claim 21 wherein said signal line represents an address line of a dynamic random access memory (DRAM) circuit.

33. The mixed swing voltage repeater circuit of claim 21 wherein said signal line represents an address line of an integrated circuit.

34. The mixed swing voltage repeater circuit of claim 21 wherein said signal line represents a read data line a memory circuit.

35. The mixed swing voltage repeater circuit of claim 21 wherein said signal line represents a write data line a memory circuit.

36. The mixed swing voltage repeater circuit of claim 21 wherein said signal line represents a clock line of an integrated circuit.

37. The mixed swing voltage repeater circuit of claim 21 wherein said signal line represents a command line of an integrated circuit.

38. The mixed swing voltage repeater circuit of claim 21 wherein said signal line represents a signal carrying conductor of an integrated circuit.

39. The mixed swing voltage repeater circuit of claim 21 wherein said integrated circuit represents a microprocessor circuit.

40. In an integrated circuit, a method for implementing a mixed swing voltage repeater circuit on a signal line having thereon full swing voltage signals, said full swing voltage signals having a full swing voltage level representing an internal voltage level at which said integrated circuit operates and for outputting reduced voltage signals, said reduced voltage signals having a voltage level that is below said full swing voltage level, said mixed swing voltage repeater circuit being configured to be coupled to said signal line and having an input node coupled to a first portion of said signal line for receiving a first full swing voltage signal and an output node coupled to a second portion of said signal line for outputting a first reduced voltage signal voltage signal, comprising:

coupling said input node to said first portion of said signal line, said input node being coupled to a first stage of said mixed swing voltage repeater circuit, said first stage being configured to receive said first full swing voltage signal;

coupling said output node to said second portion of said signal line, said output node also being coupled to a second stage of said mixed swing voltage repeater circuit, said second stage being configured to output said first reduced voltage signal on said output node responsive to said first full swing voltage signal, wherein said second stage includes at least one of a level shifter stage and an output stage, wherein said first stage includes a first inverter having a first inverter input and a first inverter output, said first inverter input being coupled to receive said first full swing voltage signal, said first inverter output being coupled to said second stage.

41. The method of claim 40 further comprising receiving a repeater enable signal, said repeater enable signal, when enabled, permits said second stage to output said first reduced voltage signal on said output node responsive to said first full swing voltage signal, said repeater enable signal, when disabled, decouples said output node from said first stage.

42. The method of claim 40 wherein said second stage includes a second inverter and a plurality of field-effect transistors coupled in series between a first reduced voltage level source having said reduced voltage level and $V_{SS}$, said second inverter having a second inverter input coupled to said first inverter output, said second inverter having a second inverter output coupled to a gate of a first field-effect transistor of said plurality of field-effect transistors.

43. The method of claim 42 further comprising
coupling a first terminal of said first field-effect transistor of said plurality of field-effect transistors to a first terminal of a second field-effect transistor of said plurality of field-effect transistors, and
coupling a gate of said second field-effect transistor of said plurality of field-effect transistors to receive said repeater enable signal.

44. The method of claim 43 further comprising
coupling a second terminal of said second field-effect transistor of said plurality of field-effect transistors to a full swing voltage source having said full swing voltage level.

45. The method of claim 42 further comprising coupling said first inverter output to a gate of a third field-effect transistor of said plurality of field-effect transistors, a first terminal of said third field-effect transistor of said plurality of field-effect transistors being coupled to said output node and a second terminal of said first field-effect transistor of said plurality of field-effect transistors.

46. The method of claim 45 further comprising
coupling a second terminal of said third field-effect transistor of said plurality of field-effect transistors to a first terminal of a fourth field-effect transistor of said plurality of field-effect transistors,
coupling a gate of said fourth field-effect transistor of said plurality of field-effect transistors to receive said repeater enable signal, and
coupling a second terminal of said fourth field-effect transistor of said plurality of field-effect transistors to $V_{SS}$.

47. The method of claim 42 further comprising
coupling a first terminal of said first field-effect transistor of said plurality of field-effect transistors to a reduced voltage source having said reduced voltage level, and coupling a second terminal of said first field-effect transistor of said plurality of field-effect transistors to a first terminal of a second field-effect transistor of said plurality of field-effect transistors, and
coupling a gate of said second field-effect transistor of said plurality of field-effect transistors to said first inverter output.

48. The method of claim 47 further comprising
coupling a second terminal of said second field-effect transistor of said plurality of field-effect transistors to $V_{SS}$.

49. The method of claim 48 further comprising providing a transmission gate having a transmission gate input and a transmission gate output, and a transmission gate control terminal with said second stage, said method further comprising:
coupling said transmission gate input to said second terminal of said first field-effect transistor of said plurality of field-effect transistors and said first terminal of said second field-effect transistor of said plurality of field-effect transistors,
coupling said transmission gate output to said output node, and
coupling said transmission gate control terminal to receive said repeater enable signal.

50. The method of claim 39 wherein said reduced voltage signals have a voltage level that is less than or equal to 1 V.

51. The method of claim 39 wherein said integrated circuit represents a microprocessor circuit.

52. A mixed swing voltage repeater circuit in an integrated circuit, said mixed swing voltage repeater circuit being configured to be coupled to a signal line having thereon full swing voltage signals, said full swing voltage signals having a full swing voltage level representing an internal voltage level at which said integrated circuit operates, and for outputting reduced voltage signals, said reduced voltage signals having a voltage level that is below said full swing voltage level, said mixed swing voltage repeater circuit having an input node coupled to a first portion of said signal line for receiving a first full swing voltage signal and an output node coupled to a second portion of said signal line for outputting a first reduced voltage signal voltage signal, comprising:
a first stage having said input node for receiving said first full swing voltage signal; and
a second stage coupled to said first stage, said second stage being configured to output said first reduced voltage signal on said output node responsive to said first full swing voltage, wherein said second stage includes at least one of a level shiftier stage and an output stage, wherein said first stage includes a first inverter having a first inverter input and a first inverter output, said first inverter input being coupled to receive said first full swing voltage signal.

53. The mixed swing voltage repeater circuit of claim 52 wherein said second stage includes a second inverter and a plurality of field-effect transistors coupled in series between a first reduced voltage level source having said reduced voltage level and $V_{SS}$, said second inverter having a second inverter input coupled to said first inverter output, said second inverter having a second inverter output coupled to a gate of a first field-effect transistor of said plurality of field-effect transistors.

54. The mixed swing voltage repeater circuit of claim 53 wherein a first terminal of said first field-effect transistor of said plurality of field-effect transistors is coupled to a first terminal of a second field-effect transistor of said plurality of field-effect transistors, and a gate of said second field-effect transistor of said plurality of field-effect transistors is coupled to receive said repeater enable signal.

55. The mixed swing voltage repeater circuit of claim 54 wherein a second terminal of said second field-effect transistor of said plurality of field-effect transistors is coupled to a full swing voltage source having said full swing voltage level.

56. The mixed swing voltage repeater circuit of claim 53 wherein said first inverter output is coupled to a gate of a third field-effect transistor of said plurality of field-effect transistors, a first terminal of said third field-effect transistor of said plurality of field-effect transistors is coupled to said output node and a second terminal of said first field-effect transistor of said plurality of field-effect transistors.

57. The mixed swing voltage repeater circuit of claim 56 wherein a second terminal of said third field-effect transistor of said plurality of field-effect transistors is coupled to a first terminal of a fourth field-effect transistor of said plurality of field-effect transistors, a gate of said fourth field-effect transistor of said plurality of field-effect transistors is coupled to receive said repeater enable signal, and a second terminal of said fourth field-effect transistor of said plurality of field-effect transistors is coupled to $V_{SS}$.

58. The mixed swing voltage repeater circuit of claim 54 wherein a first terminal of said first field-effect transistor of said plurality of field-effect transistors is coupled to a reduced voltage source having said reduced voltage level, a second terminal of said first field-effect transistor of said plurality of field-effect transistors is coupled to a first terminal of a second field-effect transistor of said plurality of field-effect transistors, and a gate of said second field-effect transistor of said plurality of field-effect transistors is coupled to said first inverter output.

59. The mixed swing voltage repeater circuit of claim 58 wherein a second terminal of said second field-effect transistor of said plurality of field-effect transistors is coupled to $V_{SS}$.

60. The mixed swing voltage repeater circuit of claim 59 further comprising a transmission gate having a transmission gate input and a transmission gate output, and a transmission gate control terminal with said second stage, said transmission gate input being coupled to said second terminal of said first field-effect transistor of said plurality of field-effect transistors and said first terminal of said second field-effect transistor of said plurality of field-effect transistors, said transmission gate output being coupled to said output node, and said transmission gate control terminal being coupled to receive said repeater enable signal.

61. The mixed swing voltage repeater circuit of claim 51 wherein said reduced voltage signals have a voltage level that is less than or equal to 1V.

62. The mixed swing voltage repeater circuit of claim 51 wherein said integrated circuit represents a microprocessor circuit.

63. A mixed swing voltage repeater circuit implemented in an integrated circuit, said mixed swing voltage repeater circuit being configured to be coupled to between a first portion of a signal line operating at a reduced voltage level and a second portion of said signal line operating at a full swing voltage level, said full swing voltage level representing an internal voltage level at which said integrated circuit operates, said mixed swing voltage repeater circuit being configured for receiving a first reduced voltage signal and outputting a first full swing voltage signal responsive to a first state of a repeater enable signal, said mixed swing voltage repeater circuit being configured for receiving said first full swing voltage signal and outputting said first reduced voltage signal responsive to a second state of said repeater enable signal, comprising a first unidirectional repeater circuit coupled between said first portion of said signal line and said second portion of said signal line, said first unidirectional repeater circuit includes a first unidirectional repeater circuit input stage having said first input node, said first input node being coupled to said first portion of said signal line, said first unidirectional repeater circuit input stage being configured to receive said first reduced voltage signal on said first portion of said signal line responsive to said first state of said repeater enable signal;

a first unidirectional repeater circuit level shifter stage coupled to said first unidirectional repeater circuit input stage, said first unidirectional repeater circuit level shifter stage being arranged to output at least one level shifter stage control signal responsive to said first reduced voltage signal when said repeater enable signal is in said first state, a voltage level of said at least one level shifter stage control signal being higher than a voltage level associated with said first reduced voltage signal; and a first unidirectional repeater circuit output stage having a first output node coupled to said second portion of said signal line, said first unidirectional repeater circuit output stage being configured to output said full swing voltage signal on said output node responsive to said at least one level shifter stage control signal when said repeater enable signal is in said first state, and a second unidirectional repeater circuit coupled between said first portion of said signal line and said second portion of said signal line, said second unidirectional repeater circuit includes a first stage having a second input node coupled to said second portion of said signal line for receiving said first full swing voltage signal on said second portion of said signal line when said repeater enable signal has a second state; and a second stage coupled to said first stage, said second stage having a second output node coupled to said first portion of said signal line, said second stage being configured to output said first reduced voltage signal on said output node responsive to said first full swing voltage when said repeater enable signal has a second state, wherein said second stage includes at least one of a level shifter stage and an output stage.

* * * * *